United States Patent
Fastow

(10) Patent No.: US 6,285,588 B1
(45) Date of Patent: Sep. 4, 2001

(54) ERASE SCHEME TO TIGHTEN THE THRESHOLD VOLTAGE DISTRIBUTION OF EEPROM FLASH MEMORY CELLS

(75) Inventor: Richard Fastow, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/495,216

(22) Filed: Jan. 31, 2000

Related U.S. Application Data

(60) Provisional application No. 60/168,600, filed on Dec. 1, 1999.

(51) Int. Cl.[7] ....................................................... G11C 7/00
(52) U.S. Cl. ................................ 365/185.19; 365/185.26; 365/185.29; 365/185.3
(58) Field of Search ...................... 365/185.19, 185.26, 365/185.29, 185.3, 185.01

(56) References Cited

U.S. PATENT DOCUMENTS

| | | | |
|---|---|---|---|
| 5,295,107 | * | 3/1994 | Okazawa et al. ................. 365/185.3 |
| 5,661,686 | * | 8/1997 | Gotou .............................. 365/185.23 |
| 5,875,130 | * | 2/1999 | Haddad et al. ................. 365/185.33 |

* cited by examiner

*Primary Examiner*—Hoai V. Ho
(74) *Attorney, Agent, or Firm*—H. Donald Nelson

(57) ABSTRACT

A method to tighten the threshold voltage distribution curve in a memory device during a negative gate source erase by applying 5 volts to the sources of all the memory cells in the memory device, allowing the drains to float and applying a negative pulse followed by a positive pulse to all the control gates of all the memory cells in the memory device. During a negative gate channel erase, the drains and sources are allowed to float, the p-well is biased at plus 5 volts and a negative pulse followed by a positive pulse is applied to all the control gates of all the memory cells in the memory device.

10 Claims, 5 Drawing Sheets

ERASE SCHEME TO TIGHTEN THE THRESHOLD VOLTAGE DISTRIBUTION OF EEPROM FLASH MEMORY CELLS

This application claims benefit of Provisional No. 60/168,600 filed Dec. 1, 1999

BACKGROUND OF THE INVENTION

1. Field of the Invention

This invention relates generally to the art of microelectronic integrated circuits. More specifically, this invention relates to the art of erasing microelectronic flash Electrically Erasable Programmable Read-Only Memory (EEPROM) devices. Even more specifically, this invention relates to a method of erasing microelectronic flash Electrically Erasable Programmable Read-Only Memory devices that tightens the threshold voltage distribution of the memory cells in the EEPROM device.

2. Discussion of the Related Art

A microelectronic flash or block erase Electrically Erasable Programmable Read-Only Memory (Flash EEPROM) device includes an array of cells that can be independently programmed and read. The size of each cell and thereby the memory device are made small by omitting transistors known as select transistors that enable the cells to be erased independently. As a result, all of the cells must be erased together as a block.

A flash memory of this type includes individual Metal-Oxide-Semiconductor (MOS) field effect transistor memory cells, each of which includes a source, a drain, a floating gate and a control gate to which various voltages are applied to program the cell with a binary 1 or 0, to erase all of the cells as a block, to read the cell, to verify that the cell is erased or to verify that the cell is not overerased.

The memory cells are connected in an array of rows and columns, with the control gates of the cells in a row being connected to a respective wordline and the drains of the cells in a column being connected to a respective bitline. The sources of all the cells are connected together. This arrangement is known as a NOR memory configuration.

A cell is programmed by applying a voltage, typically 9 volts to the control gate, applying a voltage of approximately 5 volts to the drain and grounding the source causing hot electrons to be injected from a drain depletion region into the floating gate. Upon removal of the respective programming voltages, the injected electrons are trapped in the floating gate creating a negative charge therein that increases the threshold voltage of the cell to a value in excess of approximately 4 volts.

A cell is read by applying typically 5 volts to the wordline to which the control gate of the cell is connected, applying 1 volt to the bitline to which the drain of the cell is connected, grounding the source, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, applying a relatively high voltage, typically 12 volts, to the source, grounding the control gate and allowing the drain to float erases a cell. These applied voltages cause the electrons that were injected into the floating gate during programming to undergo Fowler-Nordheim tunneling from the floating gate through the thin tunnel oxide layer to the source. In another arrangement, applying a negative voltage on the order of −10 volts to the control gate, applying 5 volts to the source and allowing the drain to float also erases a cell. A further method of erasing a cell is by applying 5V to the P-well and −10V to the control gate while allowing the source/drain to float.

A problem with the conventional flash EEPROM cell arrangement is that due to manufacturing tolerances, some cells become over-erased before other cells are sufficiently erased. The floating gates of the over-erased cells are depleted of electrons and become positively charged. The over-erased cells function as depletion mode transistors that cannot be turned off by normal operating voltages applied to their control gates. The cells functioning as depletion mode transistors introduce leakage current during subsequent program and read operations.

More specifically, during program and read operations only one wordline connected to the control gates of a row of cells is held high at a time, while the other wordlines are grounded. A positive voltage is applied to the drains of all of the cells and if the threshold voltage of an unselected cell is zero or negative, the leakage current will flow through the source, channel and drain of the cell.

The undesirable effect of the leakage current from the over-erased cells is as follows. In a typical flash EEPROM, the drains of a large number of memory transistor cells, for example 512 transistor cells are connected to each bitline. If a substantial number of cells on the bitline are drawing background leakage current, the total leakage current on the bitline can exceed the cell read current. This makes it impossible to read the state of any cell on the bitline and therefore renders the memory inoperative.

Because the background leakage current of a cell varies as a function of threshold voltage, the lower (more negative) the threshold voltage the higher the leakage current. It is therefore desirable to prevent cells from being over-erased and reduce the threshold voltage distribution to as low a range as possible, with ideally all cells having the same threshold voltage after erase on the order of 2 volts.

It is known in the art to reduce the threshold voltage distribution by performing an over-erase correction operation, which reprograms the most over-erased cells to a higher threshold voltage. An over-erase correction operation of this type is generally known as Automatic Programming Disturb (APD).

An APD method referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS," issued Jun. 24, 1997 to Lee Cleveland. This patent is assigned to the same assignee as the present invention and is incorporated herein by reference in its entirety. The method includes sensing for over-erased cells and applying programming pulses thereto, which bring their threshold voltages back up to acceptable values.

Following application of an erase pulse, under-erase correction is first performed on a cell-by-cell basis by rows. The cell in the first row and column position is addressed and erase verified by applying 4 volts to the control gate (wordline), 1 volt to the drain (bitline), grounding the source, and using sense amplifiers to sense the bitline current to determine if the threshold voltage of the cell is above a value of, for example, 2 volts. If the cell is under-erased, indicated by a threshold voltage above 2 volts, the bitline current will be low. In this case, an erase pulse is applied to all of the cells, and the first cell is erase verified again.

In the method described in U.S. Pat. No. 5,642,311, after application of each erase pulse and prior to a subsequent erase verify operation, over-erase correction is performed on all the cells in the memory. Over-erase verification is performed on the bitlines of the array or memory in sequence by grounding the wordlines, applying typically 1 volt to each bitline in sequence and sensing the bitline current. If the bitline current is above a predetermined value at least one of the cells connected to the bitline is over-erased and is drawing leakage current. In this case, an over-erase correction pulse is applied to the bitline. The over-erase correction pulse is a pulse of approximately 5 volts applied to the bitline for a predetermined length of time, typically 100 μs.

After application of the over-erase correction pulse to the bitline, the cells on the bitline are over-erase verified again. If the bitline current is still high indicating that an over-erased cell still remains connected to the bitline, another over-erase correction pulse is applied to the bitline. This procedure is repeated, as many times as necessary until the bitline current is reduced to the predetermined value that is lower than the read current. Then, the procedure is performed for the rest of the cells in the first row and following rows until all of the cells in the memory have been erase verified.

Because the background leakage current of a cell varies as a function of threshold voltage, the lower (more negative) the threshold voltage the higher the leakage current. Because there may be as many as 512 cells connected to a bitline, the background leakage current may still be sufficient to exceed the cell read current. It is therefore desirable to prevent cells from not only being over-erased but to reduce the threshold voltage distribution to as low a range as possible, with ideally all cells having the same threshold voltage after erase on the order of 2 volts.

Therefore, what is needed is a method to tighten the threshold voltage distribution to as low a range as possible by increasing the threshold voltage of the cells with the lowest threshold voltage without affecting the threshold voltage of the cells with the highest threshold voltage.

SUMMARY OF THE INVENTION

According to the present invention, the foregoing and other objects and advantages are obtained by a method of erasing flash memory cells that includes applying a negative pulse followed by a positive pulse to the control gates of the flash memory cells being erased. The effect of the positive pulse is to inject electrons into the floating gate form the channel through Fowler-Nordheim tunneling. Those cells having the lowest threshold voltages will experience the highest tunneling fields and hence will have more electrons injected into the floating gate. This process will tend to compact the threshold voltage distribution.

In accordance with a first embodiment of the present invention, during a negative gate source erase, in addition to the negative pulse followed by a positive pulse applied to the control gates of the flash memory cells being erased, a voltage of 5 volts is applied to the sources of the memory cells being erased and the drains of the memory cells being erased are allowed to float.

In accordance with a second embodiment of the present invention, during a negative gate channel erase, in addition to the negative pulse followed by a positive pulse applied to the control gates of the flash memory cells being erased, the drains and sources of the memory cells being erased are allowed to float.

In accordance with an aspect of the invention, the negative pulse applied to the control gates is approximately 10 volts.

In accordance with another aspect of the invention, the positive pulse applied to the control gates is approximately 10 volts.

In accordance with another aspect of the invention, the magnitude of the positive pulse, the length in time of the positive voltage pulse, the length in time of the negative voltage pulse and the length in time between the negative voltage pulse and the positive voltage pulse is determined during a characterization procedure for the memory device.

The described method thus provides a method of erasing a memory device that tightens the threshold voltage distribution of the cells in the memory device.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention that illustrate the best mode presently contemplated by the inventors for practicing the invention.

Figure 1A:
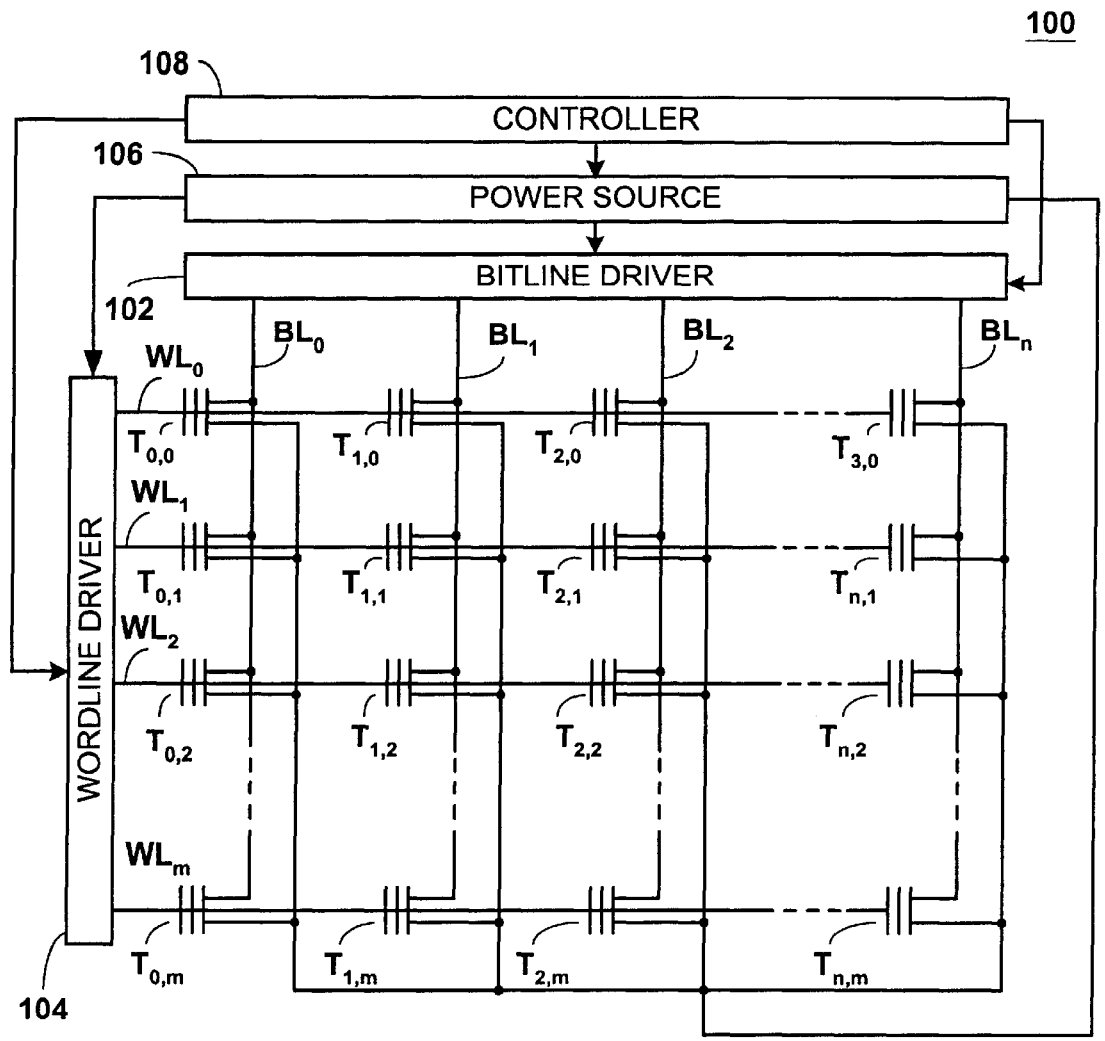
FIG. 1A is a simplified electrical schematic diagram of a flash EEPROM.

FIG. 1A illustrates a basic configuration of a NOR type flash Electrically Erasable Programmable Read-Only Memory (EEPROM) 100 to which the present invention is advantageously applied. The flash memory 100 comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_0$ to $BL_n$ and the wordlines are designated as $WL_0$ to $WL_m$. A bitline driver 102 applies appropriate voltages to the bitlines and a wordline driver 104 applies appropriate voltages to the wordlines. The voltages applied to the drivers 102 and 104 are generated by a power source 106 under the control of a controller 108, which is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 1A are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power source 106.

Figure 1B:
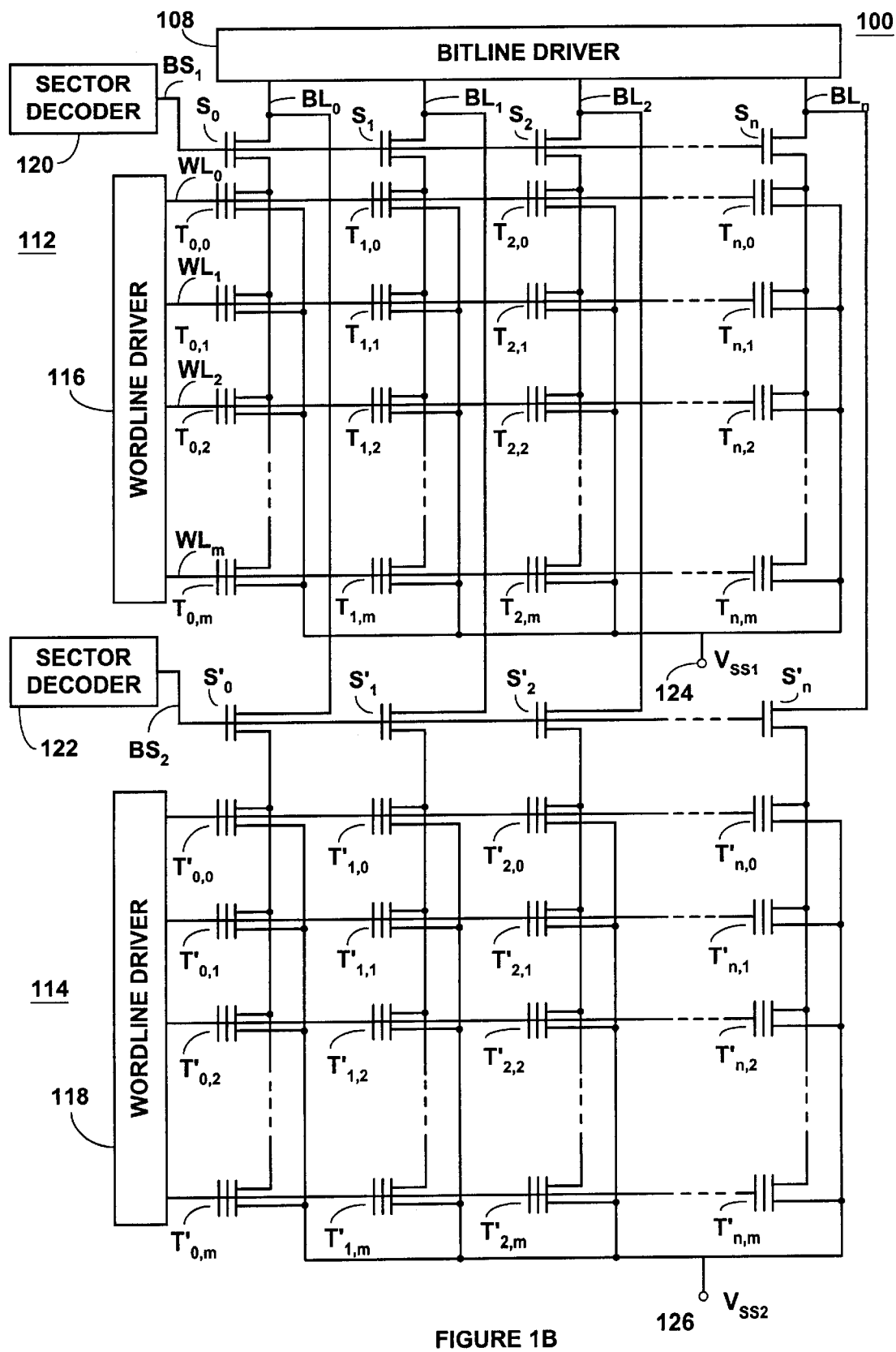
FIG. 1B is similar to FIG. 1A but illustrates a flash EEPROM having cells arranged in two pages of banks.

FIG. 1B illustrates another flash EEPROM memory 110 which is similar to the memory 100 except that the cells are divided into a banks, (also known as pages or sectors), two of which are shown in FIG. 1B, each of which can be programmed, erased, and read independently. The memory 110 includes a first cell bank or page 112 and a second cell bank or page 114. The memory cells in the first bank 112 are designated in the same manner as in FIG. 1A, whereas a prime symbol is added to the designations of the cells in the second bank 114. The wordlines of the banks 112 and 114 are connected to separate wordline drivers 116 and 118, respectively.

In addition to the memory cells, each bank 112 and 114 includes a select transistor for each bitline. The select transistors for the banks 112 and 114 are designated as $S_0$ to $S_n$ and $S'_0$ to $S'_n$, respectively. The drains of the select transistors are connected to the respective bitlines, whereas the sources of the select transistors are connected to the drains of the transistors for the wordlines $WL_0$ to $WL_m$ and $WL'_0$ to $WL'_m$.

The select transistors differ from the memory cell transistors in that they are conventional MOSFETs and therefore lack floating gates. The select transistors are switching elements rather than memory elements. The gates of the select transistors for the bank 112 are connected to a bank select $BS_1$ of a sector decoder 120 and the gates of the select transistors for the bank 114 are connected to a bank select output $BS_2$ of a sector decoder 122.

The sources of the cells in bank 112 are connected to a common source supply voltage $V_{ss1}$ 124 and the sources of the cells in the bank 114 are connected to a common source supply voltage $V_{ss2}$ 126.

The bank 112 is selected by applying a logically high signal to the bank select line $BS_1$ that turns on the transistors $S_0$ to $S_n$ and connects the bitlines $BL_0$ to $BL_n$ to the underlying memory cells. The bank 112 is deselected by applying a logically low signal to the bank select line $BS_1$ that turns off the transistors $S_0$ to $S_n$ and disconnects the memory cells from the bitlines. The bank 114 is selected and deselected in an essentially similar manner using the bank select signal $BS_2$ and select transistors $S'_0$ to $S'_n$. The operation of the memory 110 is essentially similar to that of the memory 100 (FIG. 1A), except that the program, erase and read operations can be performed on the banks 112 & 114 independently.

Figure 2A:
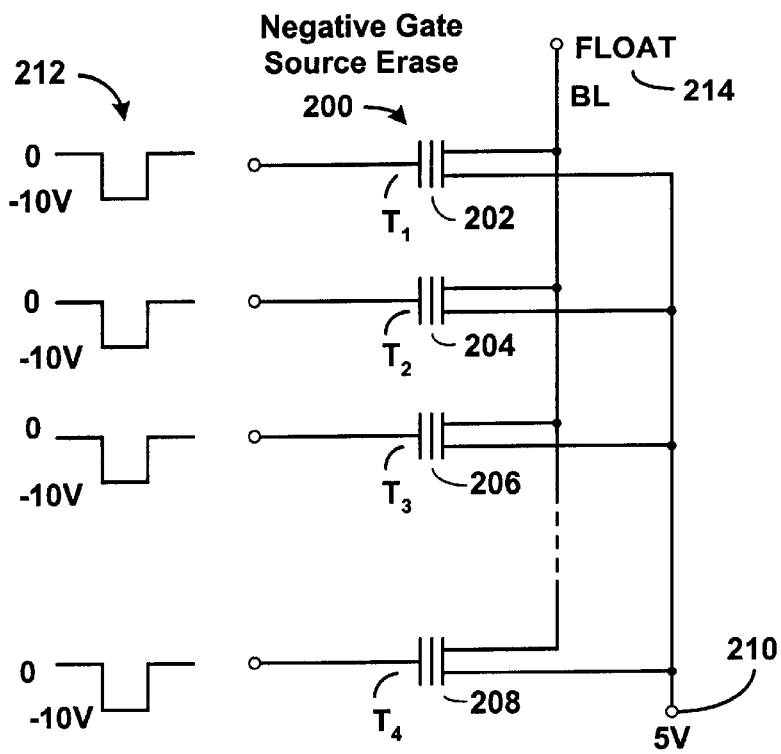
FIG. 2A is a simplified electrical schematic diagram of a column of flash EEPROM cells showing the control gate, source and drain voltages during a first prior art method of erasing the cells in the column.

FIG. 2A is a simplified electrical schematic diagram of a column 200 of flash EEPROM cells 202, 204, 206, and 208 and showing the control gate, source and drain voltages during a negative gate source erase of all of the flash cells. As is known in the art, all of the cells are erased simultaneously. In the erasure method shown in FIG. 2A, a moderately high voltage, typically 5 volts, is applied to the sources as shown at 210, a negative voltage of approximately minus 10 volts is applied to all the control gates as shown at 212 and the drains are floated as shown at 214. This causes the electrons that were injected into the floating gate during programming to be removed by Fowler-Nordheim tunneling from each of the floating gates through the respective tunnel oxide layers to the respective source regions.

Figure 2B:
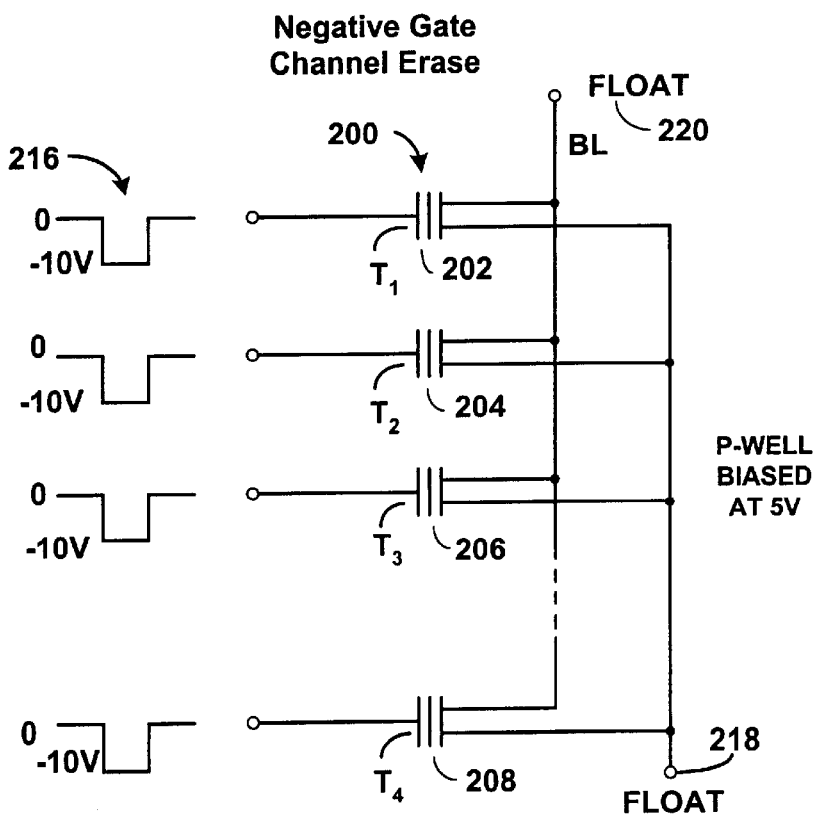
FIG. 2B is a simplified electrical schematic diagram of a column of flash EEPROM cells showing the control gate, source and drain voltages during a second prior art method of erasing the cells in the column.

FIG. 2B shows an alternative method of erasing the column 200 of flash EPROM cells 202, 204, 206, and 208 and showing the control gate, source and drain voltages during a negative gate channel erase of all of the flash cell. As is known is know in the art, all of the cell are erased simultaneously. In the erasure method shown in FIG. 2B, the P-well is biased at 5 volts, a negative voltage on the order of minus 10 volts is applied to the control gates as shown at 216 and the sources and drains are floated as indicated at 218 and 220, respectively.

Figure 4A:
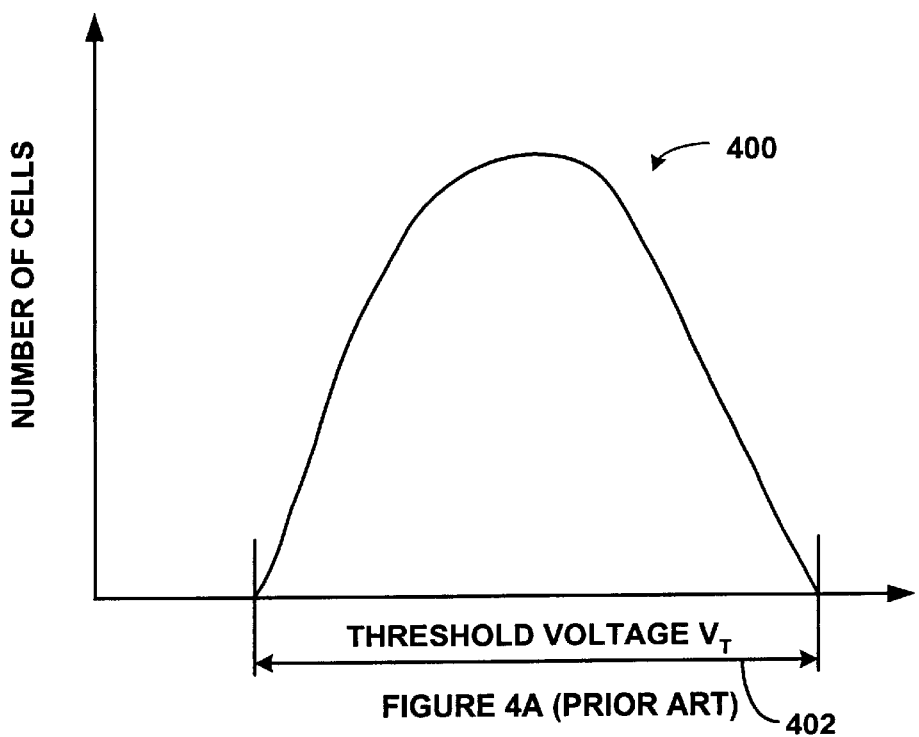
FIG. 4A is a graph of a typical threshold voltage distribution after an erase procedure shown in FIGS. 2A or 2B.

Referring now to FIG. 4A is a graph of a typical threshold voltage distribution after the erase procedures shown in FIGS. 2A & 2B. As is known in the art, the width of the threshold voltage distribution, indicated at 402 is caused by differences in cell manufacturing tolerances and, as discussed above, some cells erase more quickly than others and, as a result, will have different threshold voltages than other cells in the same flash memory device. As can be appreciated, the ideal threshold voltage distribution would have a width of zero, however, the narrower the threshold voltage distribution, the better for operation of the flash memory device and for reliability of the flash memory device.

Figure 3A:
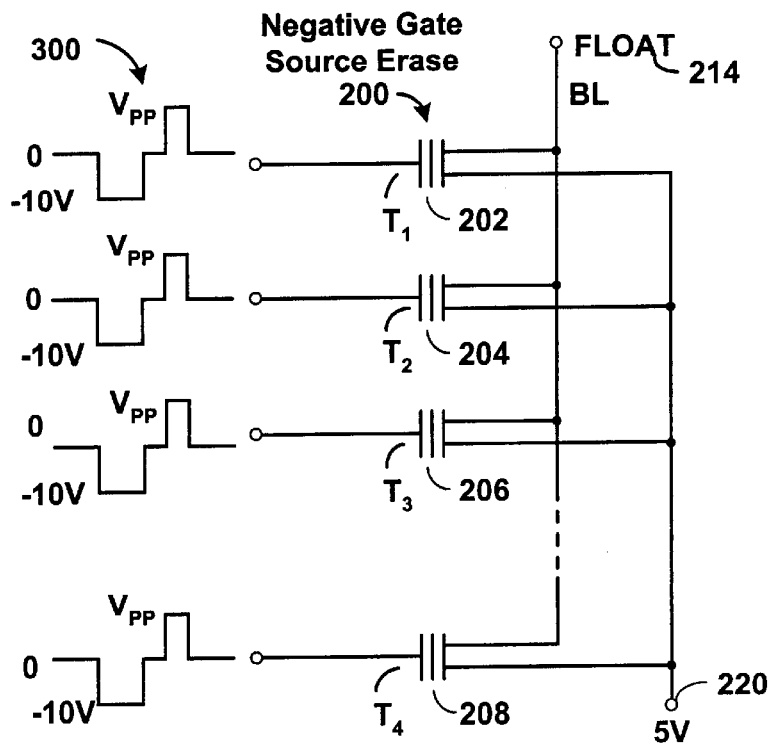
FIG. 3A is a simplified electrical schematic diagram of the column of flash EEPROM cells shown in FIG. 2A showing the control gate, source and drain voltages during a first method of erasing the cells in the column in accordance with the present invention.

FIG. 3A is the simplified electrical schematic diagram of the column 200 of flash EEPROM cells 202, 204, 206, and 208 as shown in FIG. 2A. FIG. 3A shows the control gate, source and drain voltages during a negative gate source erase of all of the flash cells in accordance with the present invention. In the erasure method shown in FIG. 3A, a moderately high voltage, typically 5 volts, is applied to the sources as shown at 210 and the drains are floated as shown at 214. However, instead of a single voltage pulse of minus 10 volts, a first pulse of minus 10 volts followed by a positive voltage pulse $V_{PP}$, as shown at 300, is applied to the control gates of all the memory cells. The positive voltage pulse is applied immediately after the minus 10 volt pulse and the positive voltage pulse is approximately 10 volts. The actual amount of the positive pulse, the duration of the positive pulse and the time between the end of the minus 10 volt pulse and the positive pulse is determined during a device characterization procedure, which can be accomplished empirically or by computer simulation. The result of the application of the positive pulse after the negative pulse is to narrow the threshold voltage distribution of the flash memory device and reduce the number of trapped holes.

Figure 3B:
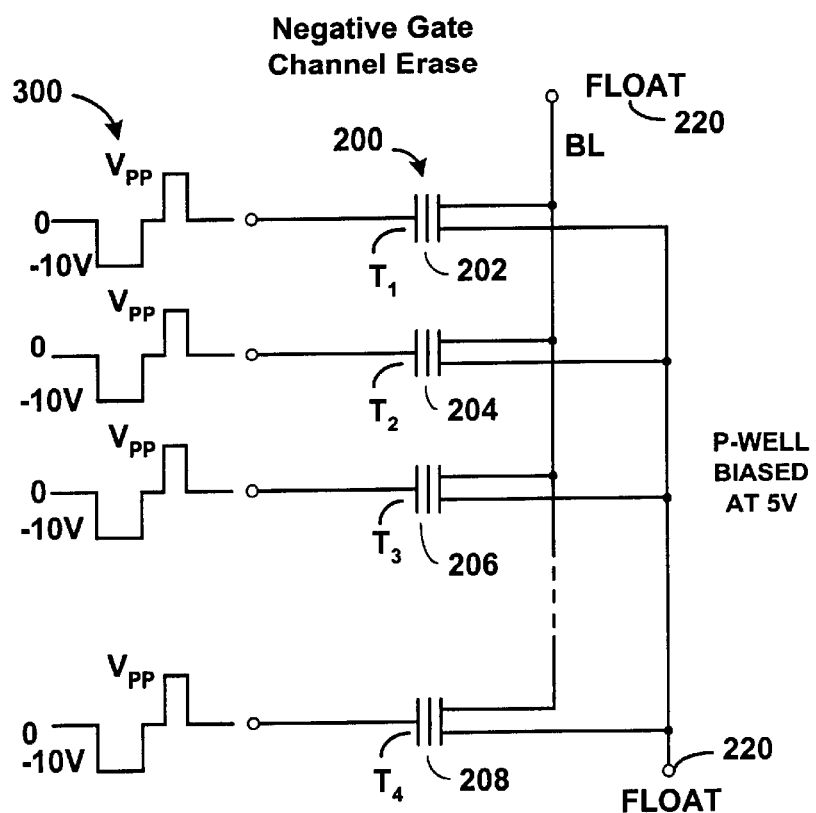
FIG. 3B is a simplified electrical schematic diagram of the column of flash EEPROM cells shown in FIG. 2B showing the control gate, source and drain voltages during a second method of erasing the cells in the column in accordance with the present invention.

FIG. 3B is the simplified electrical schematic diagram of the column 200 of the flash EEPROM cells 202, 204, 206, and 208 as shown in FIG. 2B. FIG. 3B shows the control gate, source and drain voltages during a negative gate channel erase of all of the flash cells in accordance with the present invention. In the erasure method shown in FIG. 3B, the P-well is biased at 5 volts and the sources and drains are floated as indicated at 218 and 220, respectively. However, instead of a single voltage pulse of minus 10 volts, a first pulse of minus 10 volts followed by a positive pulse voltage pulse $V_{PP}$, as shown at 300 is applied immediately after the minus 10 volt pulse and the positive voltage pulse is approximately 10 volts. The actual amount of the positive pulse, the duration of the positive pulse and the time between the end of the minus 10 volt pulse and the positive pulse is determined during a device characterization procedure, which can be accomplished empirically or by computer simulation. The result of the application of the positive pulse after the negative pulse is to narrow the threshold voltage distribution of the flash memory device and reduce the number of trapped holes.

Figure 4B:
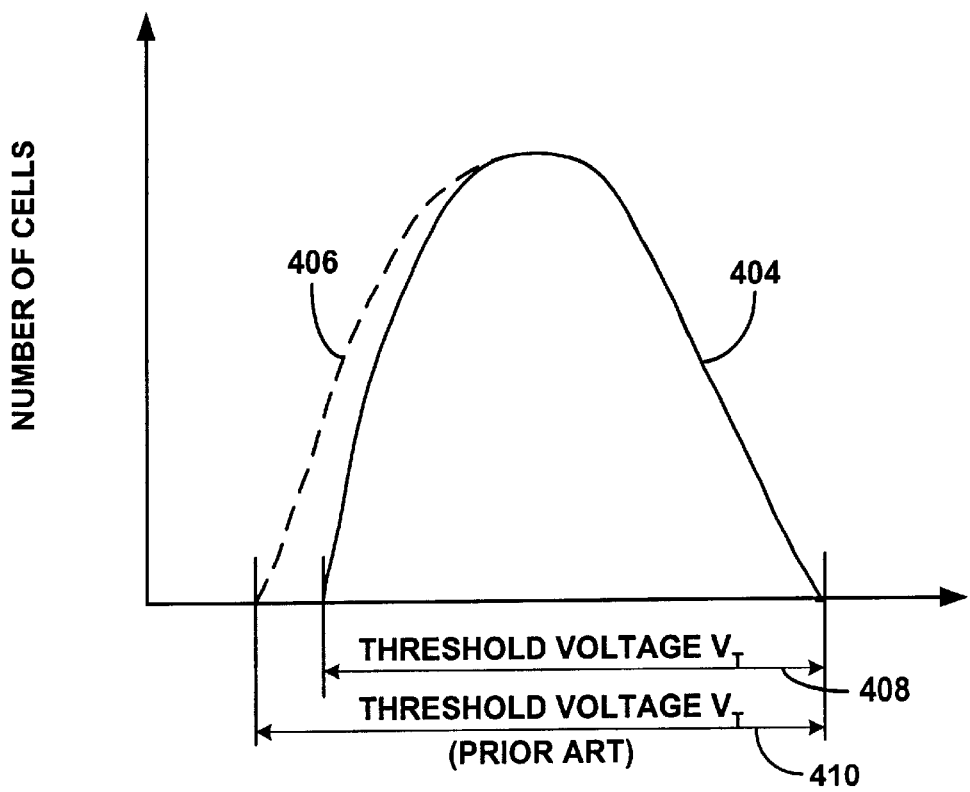
FIG. 4B is a graph of a typical threshold voltage distribution after an erase procedure shown in FIGS. 3A or 3B.

FIG. 4B is a graph of the threshold voltage distribution 404 after the erase procedures shown in FIGS. 3A & 3B. Also shown is the graph of the threshold voltage distribution 406 after the prior art erase procedures shown in FIGS. 2A & 2B. The threshold voltage distribution has become more compact, that is the width of the threshold voltage distribution in accordance with the present invention, indicated at 408, is less than the width of the threshold voltage distribution of the prior art methods, indicated at 410.

In summary, the present invention overcomes the limitations of the prior art and tightens the threshold voltage distribution in a flash EEPROM.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method to tighten the threshold voltage distribution curve in a memory device composed of multiple memory cells each having a source, a drain, a floating gate and a control gate, wherein the memory cells are organized in rows and columns with the rows being wordlines and the columns being bitlines, the method comprising:

(a) applying a voltage of approximately 5 volts to the sources of all the memory cells;

(b) allowing the drains of the all the memory cells to float; and (c) applying a negative voltage pulse followed by a positive voltage pulse to the control gates of all the memory cells, wherein a magnitude of the magnitude of the positive voltage pulse, a length in time of the positive voltage pulse, a length in time of the negative voltage pulse and a length in time between the negative voltage pulse and the positive voltage pulse is determined during a characterization procedure for the memory device.

2. The method of claim 1 wherein the negative voltage pulse is approximately minus 10 volts.

3. The method of claim 2 wherein the positive pulse is between 5 and 10 volts.

4. The method of claim 3 wherein the characterization procedure is an empirical determination.

5. The method of claim 3 wherein the characterization procedure is a computer simulation.

6. A method to tighten the threshold voltage distribution curve in a memory device composed of multiple memory cells each having a source, a drain, a floating gate and a control gate, wherein the memory cells are formed in a p-well and are organized in rows and columns with the rows being wordlines and the columns being bitlines, the method comprising:

(a) applying 5 volts to the p-well;

(b) allowing the drains and the sources of the memory cells to float;

(c) applying a negative voltage pulse followed by a positive voltage pulse to the control gates of all the memory cells, wherein a magnitude of the positive pulse, a length in time of the positive voltage pulse, a length in time of the negative voltage pulse and a length in time between the negative voltage pulse and the positive voltage pulse is determined during a characterization procedure for the memory device.

7. The method of claim 6 wherein the negative voltage pulse is approximately minus 10 volts.

8. The method of claim 7 wherein the positive voltage pulse is approximately 10 volts.

9. The method of claim 8 wherein the characterization procedure is an empirical determination.

10. The method of claim 8 wherein the characterization procedure is a computer simulation.

* * * * *